(12) United States Patent
Morimoto et al.

(10) Patent No.: US 6,277,222 B2
(45) Date of Patent: *Aug. 21, 2001

(54) ELECTRONIC COMPONENT CONNECTING METHOD

(75) Inventors: Ryoichi Morimoto, Shiga-ken; Koichi Nitta, Omihachiman, both of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,481

(22) Filed: Apr. 26, 1999

(30) Foreign Application Priority Data

Apr. 30, 1998 (JP) .................................................. 10-120170

(51) Int. Cl.⁷ .............................. H05K 3/32; H01L 21/60
(52) U.S. Cl. ................................. 156/60; 156/277; 29/740
(58) Field of Search ........................................ 156/277, 297, 156/60; 438/612, 613; 29/832, 739, 740; 361/764; 257/778

(56) References Cited

U.S. PATENT DOCUMENTS

| | | | |
|---|---|---|---|
| 5,040,069 | * | 8/1991 | Matsumoto et al. ............ 358/213.11 |
| 5,840,417 | * | 11/1998 | Bolger . |
| 5,916,407 | * | 6/1999 | Gruenwald et al. . |
| 6,107,122 | * | 8/2000 | Wood et al. ........................ 438/117 |
| 6,109,175 | * | 8/2000 | Kinoshita ........................... 101/170 |
| 6,189,208 | * | 2/2001 | Estes et al. ........................... 29/840 |

* cited by examiner

Primary Examiner—Michael W. Ball
Assistant Examiner—John T. Haran
(74) Attorney, Agent, or Firm—Ostrolenk, Faber, Gerb & Soffen

(57) ABSTRACT

An electronic component connecting method of connecting a first electronic component and a second electronic component via a connecting structure like a bump electrode in which a thermosetting conductive adhesive is applied on connecting electrodes on an IC chip, which serves as the first electronic component, by printing or the like, and is hardened, whereby tapered projecting electrodes as bump electrodes are formed to project in the form of, for example, a circular cone. Then, a conductive adhesive for connection is applied on the projecting electrodes. Before the conductive adhesive for connection is hardened, the IC chip is aligned with a wiring board, which serves as the second electronic component, so that the ends of the projecting electrodes and connecting electrodes on the wiring board are in contact with each other. In this aligned state, the conductive adhesive for connection is hardened.

10 Claims, 2 Drawing Sheets

ELECTRONIC COMPONENT CONNECTING METHOD

BACKGROUND OF THE INVENTION

1. Field of the Invention

The present invention relates to an electronic component connecting method, and more particularly, to an electronic component connecting method suitable for use in mounting a chip-type electronic component, such as an IC chip, on a wiring board.

2. Description of the Related Art

FIGS. 2A to 2F show a conventional electronic component connecting method disclosed in Japanese Unexamined Patent Publication No. 5-190599. This connecting method results in the state shown in FIG. 2F, in which an IC chip 1 serving as a first electronic component is mounted on a wiring board 2 serving as a second electronic component.

First, as shown in FIG. 2A, an IC wafer 3 is prepared as a mother component which is later cut (FIG. 2C) to form a plurality of the IC chips 1. On one main surface 4 of the IC wafer 3, connecting electrodes 5 are formed at predetermined positions in regions corresponding to the IC chips 1.

Three connecting electrodes 5 are shown in FIG. 2A. On the right-side connecting electrode 5, a projecting electrode 6 is formed to serve as a bump electrode. FIG. 2A sequentially illustrates the process of forming this projecting electrode 6 in connection with the left-side connecting electrode 5, the center connecting electrode 5, and the right-side connecting electrode 5.

The projecting electrode 6 is basically formed by ball bonding. First, as illustrated in connection with the left-side connecting electrode 5 in FIG. 2A, a ball 9 is formed at the leading end of a gold wire 8 that passes through a capillary 7. Next, the ball 9 is placed on the connecting electrode 5, as illustrated in connection with the center connecting electrode 5, and is pressed against the connecting electrode 5 by the capillary 7. Then, the gold wire 8 is cut off the ball 9, as illustrated in connection with the right-side connecting electrode 5 in FIG. 2A. In this way, the projecting electrode 6 is given a two-stage structure by the ball 9 and a part of the gold wire 8.

By repeating the above-described steps, projecting electrodes 6 that serve as bump electrodes are formed on all the connecting electrodes 5 on the main surface 4 of the IC wafer 3, as shown in FIG. 2B.

Subsequently, as shown in FIG. 2C, the IC wafer 3 is cut into a plurality of IC chips 1 by, for example, dicing.

Then, a conductive adhesive 10 is applied on the projecting electrodes 6 formed on the connecting electrodes 5 of the IC chip 1 by, for example, dipping, as shown in FIG. 2D.

Also shown in FIG. 2D is the preparation of the wiring board 2. On one main surface 11 of the wiring board 2, connecting electrodes 12 are formed corresponding to the connecting electrodes 5 on the IC chip 1.

Next, the IC chip 1 is pressed against the wiring board 2, as shown in FIG. 2E, while the main surface 4 of the IC chip 1 and the main surface 11 of the wiring board 2 are opposed to each other, as shown in FIG. 2D. In this case, since the conductive adhesive 10 is not hardened, it deforms to follow the surfaces of the connecting electrodes 12 on the wiring board 2, and is brought into close contact with the projecting electrodes 6 and the connecting electrodes 12. Furthermore, since the projecting electrodes 6 have a two-stage structure, spaces are formed between the projecting electrodes 6 and the connecting electrodes 12 so as to receive the conductive adhesive 10. For this reason, the conductive adhesive 10 does not generally spread out in a horizontal direction.

Subsequently, the conductive adhesive 10 is hardened while the IC chip 1 and the wiring board 2 are aligned with each other, as shown in FIG. 2E.

Next, as shown in FIG. 2F, a filling material 13 is applied and hardened between the IC chip 1 and the wiring board 2. The filling material 13 serves to reinforce the connected portion between the IC chip 1 and the wiring board 2, to relax thermal stress, and to improve moisture resistance of the IC chip 1, and is filled in a clearance between the IC chip 1 and the wiring board 2.

In this way, according to the conventional electronic component connecting method shown in FIGS. 2A to 2F, since the projecting electrodes 6 have a two-stage structure, spaces are formed between the projecting electrodes 6 and the connecting electrodes 12 so as to receive the conductive adhesive 10, as described above. Therefore, even when the IC chip 1 is pressed against the wiring board 2, the conductive adhesive 10 is prevented from being horizontally spread out. This makes it possible to reduce the pitch between a plurality of connecting electrodes 5 and the pitch between a plurality of connecting electrodes 12, to reduce the size of the IC chip 1, and to improve packaging density.

The electronic component connecting method shown in FIGS. 2A to 2F has, however, the following problems which must be solved.

First, a plurality of steps shown in FIG. 2A must be performed to form a projecting electrode 6 having a two-stage structure, and be repeated for each of the connecting electrodes 5. Therefore, much time is taken to form projecting electrodes 6 on all the connecting electrodes 5, and the length of time is proportional to the number of the connecting electrodes 5. In particular, the time to process becomes longer as the arrangement density of the connecting electrodes 5 increases. This results in an increase in cost.

In the above-described ball bonding for forming the projecting electrodes 6, metal-to-metal solid phase bonding is performed by applying load and ultrasonic energy, and this may cause damage to the IC wafer 3, and further, to the IC chip 1.

In order to reduce such damage, an active area, where elements such as a capacitor and a transistor are arranged, must not be placed directly below the connecting electrodes 5. This countermeasure, however, produces another problem in that the size of the IC chip 1 is increased to form the connecting electrodes 5 outside the active area.

SUMMARY OF THE INVENTION

Accordingly, it is an object of the present invention to provide an electronic component connecting method that can solve the above problems.

The present invention is aimed at a method of electrically connecting a first electronic component having a first connecting electrode, and a second electronic component having a second connecting electrode via the first and second connecting electrodes, and includes the following steps to solve the above-described technical problems.

According to an aspect of the present invention, the electronic component connecting method includes the steps of forming a projecting electrode serving as a bump electrode by applying and hardening a thermosetting conductive adhesive on a first connecting electrode; applying a conductive adhesive for connection on at least one of the projecting electrode and a second connecting electrode; aligning (positioning) the first electronic component and the second electronic component before hardening the conductive adhesive for connection so that the end of the projecting electrode and the second connecting electrode are in contact with each other; and hardening the conductive adhesive for connection while the first electronic component and the second electronic component are aligned (positioned) with each other.

Preferably, the projecting electrode is tapered and projects in the shape of a cone, such as a circular cone or a pyramid.

According to another aspect of the present invention, the electronic component connecting method includes the steps of forming a tapered projecting electrode serving as a bump electrode by applying and hardening a thermosetting conductive adhesive on the first connecting electrode by printing; applying a conductive adhesive for connection on at least one of the projecting electrode and the second connecting electrode; aligning the first electronic component and the second electronic component before hardening the conductive adhesive for connection so that the end of the projecting electrode and the second connecting electrode are in contact with each other; and hardening the conductive adhesive for connection while the first electronic component and the second electronic component are aligned with each other.

The first electronic component may be prepared in the form of a mother component that is to be cut later into a plurality of components. In this case, it is preferable that at least the step of forming the projecting electrode be performed before cutting the mother component. Furthermore, it is preferable that the electronic component connecting method of this case further include the step of cutting the mother component into a plurality of first electronic components.

Preferably, the conductive adhesive for connection is applied on the projecting electrode by dipping.

A filling material may be applied between the first electronic component and the second electronic component after the step of hardening the conductive adhesive for connection.

The present invention is suitably applied to, for example, a case in which the first electronic component is a chip-type electronic component, such as an IC chip, and the second electronic component is a wiring board.

Further objects, features, and advantages of the present invention will become apparent from the following description of the preferred embodiments with reference to the attached drawings.

DESCRIPTION OF THE PREFERRED EMBODIMENTS

Figure 1A:
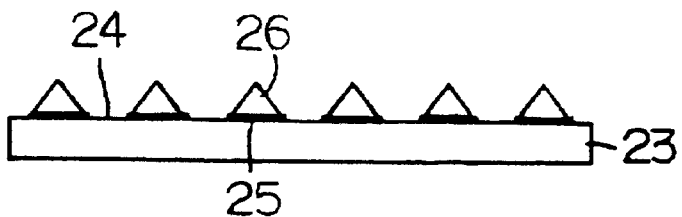
FIGS. 1A to 1E are illustrative sectional views sequentially showing the steps included in an electronic component connecting method according to an embodiment of the present invention.
Figure 1B:
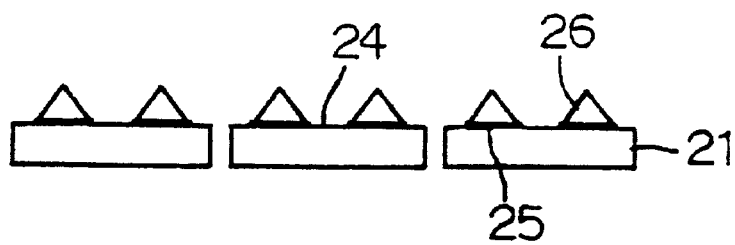
Figure 1C:
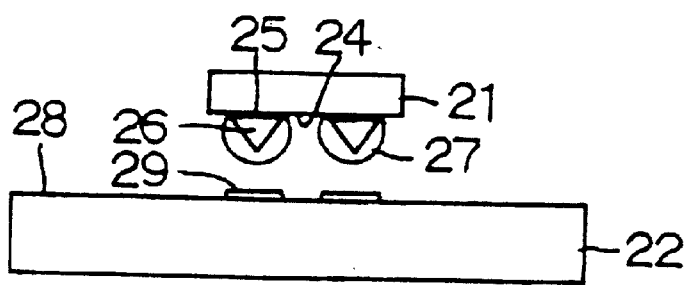
Figure 1D:
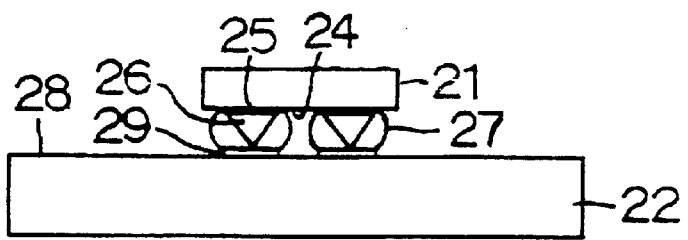
Figure 1E:
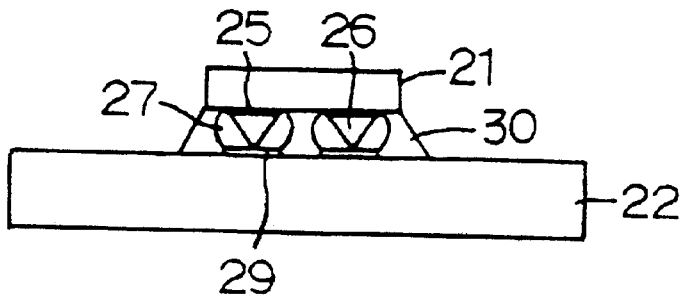
Figure 2A:
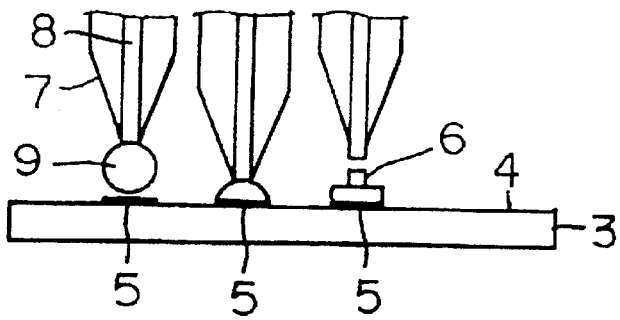
FIGS. 2A to 2F are illustrative sectional views sequentially showing the steps included in a conventional electronic component connecting method.
Figure 2B:
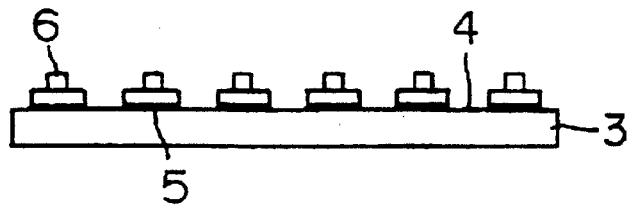
Figure 2C:
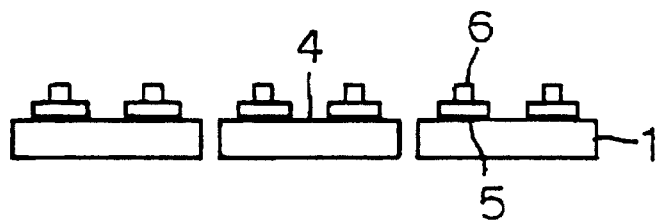
Figure 2D:
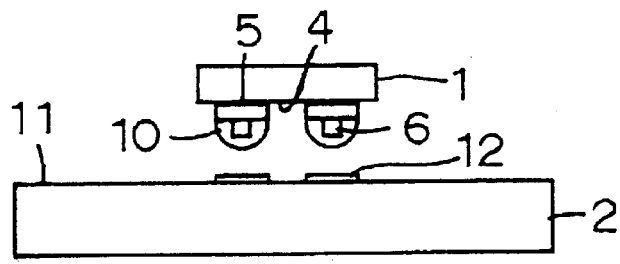
Figure 2E:
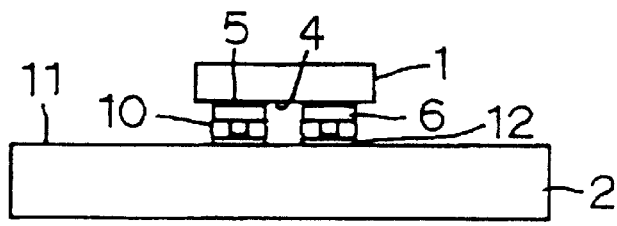
Figure 2F:
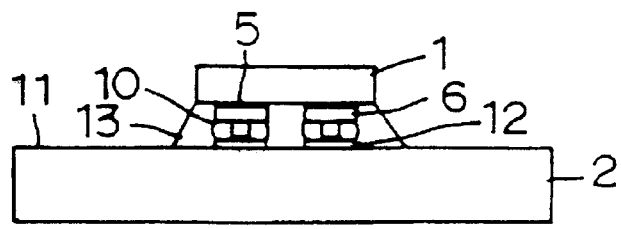

FIGS. 1A to 1E show an electronic component connecting method according to a preferred embodiment of the present invention. According to this embodiment, a state shown in FIG. 1E is obtained in which an IC chip 21 serving as a first electronic component is mounted on a wiring board 22 serving as a second electronic component.

First, as shown in FIG. 1A, an IC wafer 23 is prepared in the form of a mother component which is later cut (FIG. 1B) to form a plurality of the IC chips 21. On one main surface 24 of the IC wafer 23, a plurality of connecting electrodes 25 are formed in areas corresponding to the regions of the IC chips 21 that will be cut out from the IC wafer 23. The IC wafer 23 is shaped like, for example, a disk having a diameter of six inches.

Next, as similarly shown in FIG. 1A, a thermosetting conductive adhesive is applied onto the connecting electrodes 25, and is hardened to form tapered projecting electrodes 26. The projecting electrodes 26 function as bump electrodes, and are shaped like, for example, a circular cone having a base diameter of 100 μm and a height of approximately 40 μm to 50 μm.

Such projecting electrodes 26 in the form of a circular cone can be efficiently formed by, for example, printing using a metal mask. That is, by optimizing the printing conditions and the kinematic viscosity (rheological property) of the conductive adhesive, the conductive adhesive can be easily and naturally shaped like a circular cone without any special processing after printing. Furthermore, the height and diameter of the printed conductive adhesive, i.e., the height and diameter of the projecting electrodes 26 formed by hardening the conductive adhesive, can be arbitrarily altered by changing the design of the metal mask for use in printing.

When the conductive adhesive for the projecting electrodes 26 is applied by using printing as described above, it is possible to apply the conductive adhesive onto all the connecting electrodes 25 on the IC wafer 23 in one process, and to harden the conductive adhesive in one process. Therefore, a plurality of projecting electrodes 26 can be formed efficiently.

The projecting electrodes 26 may be shaped like a pyramid instead of a circular cone. The projecting electrodes 26 may also be shaped like, for example, a hemisphere, instead of a cone. For example, when the projecting electrodes 26 are formed in the shape of a circular cone by applying the conductive adhesive by printing, the vertexes thereof are not always pointed, but are usually rounded because of the surface tension of the conductive adhesive, or for other reasons.

Next, the IC wafer 23 is cut, as shown in FIG. 1B, so as to obtain a plurality of IC chips 21.

Subsequently, as shown in FIG. 1C, a conductive adhesive 27 for connection is applied onto the projecting electrodes 26. The conductive adhesive 27 may be thermosetting or thermoplastic. In applying the conductive adhesive 27 on the projecting electrodes 26, dipping is suitably used. That is, the projecting electrodes 26 are dipped in a bath containing the conductive adhesive 27 while the main surface 24 of the IC chip 21 is kept in parallel with the surface of the bath. This makes it possible to easily and efficiently apply a desired amount of conductive adhesive 27 on all the projecting electrodes 26.

The conductive adhesive 27 may be applied on the projecting electrodes 26 by methods other than dipping, such as printing, or transfer printing.

Also shown in FIG. 1C is the preparation of the wiring board 22. On one main surface 28 of the wiring board 22, connecting electrodes 29 are formed corresponding to the projecting electrodes 26 on the IC chip 21.

Next, as shown in FIG. 1D, the IC chip 21 is pressed against the wiring board 22 in a state in which the main surface 24 of the IC chip 21 and the main surface 28 of the wiring board 22 are opposed to each other. The ends of the projecting electrodes 26 are thereby brought into contact with the connecting electrodes 29, and the conductive adhesive 27 for connection is deformed to follow the surfaces of the connecting electrodes 29. As a result of the deformation, the conductive adhesive 27 for connection is in close contact with both the projecting electrodes 26 and the connecting electrodes 29.

While the conductive adhesive 27 for connection is applied after the IC chips 21 are obtained in the above illustrated embodiment, as shown in FIG. 1C, it may be applied before the IC wafer 23 is cut. Furthermore, while the conductive adhesive 27 for connection is applied onto the projecting electrodes 26 on the IC chip 21 in the above embodiment, it may be applied onto the connecting electrodes 29 on the wiring board 22, or onto both the projecting electrodes 26 and the connecting electrodes 29. Furthermore, the conductive adhesive 27 for connection may be applied after the ends of the projecting electrodes 26 and the connecting electrodes 29 are brought into contact with each other, as shown in FIG. 1D.

Subsequently, as similarly shown in FIG. 1D, the conductive adhesive 27 for connection is hardened with the IC chip 21 and the wiring board 22 aligned with each other.

Next, a filling material 30 is applied and hardened between the IC chip 21 and the wiring board 22, as shown in FIG. 1E. The filling material 30 is applied to reinforce the connected portion between the IC chip 21 and the wiring board 22, to alleviate thermal stress, and to improve the moisture resistance of the IC chip 21. Preferably, the filling material 30 is applied to fill up the space between the IC chip 21 and the wiring board 22.

While the present invention has been described with reference to what is presently considered to be the preferred embodiment, it is to be understood that the invention is not limited to the embodiment shown in FIGS. 1A to 1E. On the contrary, the invention is intended to cover various modifications and equivalent arrangements included within the spirit and scope of the appended claims.

While the thermosetting conductive adhesive for the projecting electrodes 26 are applied by printing, it may be applied by other methods, e.g., transfer printing, as long as it can be given a tapered form.

While the projecting electrodes 26 are formed on the IC chip 21 in the embodiment shown in FIGS. 1A to 1E, they may be formed on the wiring board 22.

The electronic component connecting method of the present invention may be applied not only to the connection between the IC chip 21 and the wiring board 22, as shown in FIGS. 1A to 1E, but also to a case in which a chip-type electronic component other than the IC chip 21 is mounted on a wiring board, a case in which chip-type electronic components are connected to each other, and a case in which wiring boards are connected to each other.

As described above, according to the present invention, a thermosetting conductive adhesive is applied onto the first connecting electrode to be connected by, for example, printing, and is hardened, whereby a tapered projecting electrode is formed to serve as a bump electrode. Therefore, while the second connecting electrode to be connected to the first connecting electrode is in contact with the end of the projecting electrode, a space can be formed therebetween so as to receive a conductive adhesive for connection. This prevents the conductive adhesive for connection from being horizontally spread out. For this reason, it is possible to reduce the arrangement pitch of the connecting electrodes, to reduce the size of the electronic components, and to increase mounting density.

Furthermore, the projecting electrodes have already been hardened in the step of aligning the first electronic component and the second electronic component while the end of the projecting electrode and the second connecting electrode are in contact with each other. Therefore, it is possible to stably maintain the space between the first electronic component and the second electronic component, and to thereby achieve stable connection.

Furthermore, the present invention does not include a step in which undesirable stress is applied on the first or second electronic component, and this differs from the conventional solid phase bonding step of applying ultrasonic energy and load. Therefore, it is possible to dispose an active area directly below the connecting electrodes without any problem, and to thereby reduce the size of the electronic component.

In the present invention, when a printing method is employed for the thermosetting conductive adhesive being applied to form projecting electrodes, the conductive adhesive can be applied onto each of a plurality of connecting electrodes in one process. This provides high efficiency and high mass productivity, and reduces cost. Furthermore, the conductive adhesive can be easily and naturally projected in the shape of a cone, e.g., a circular cone, by optimizing the printing conditions and the kinematic viscosity (rheological property) thereof. For this reason, the projecting electrodes formed by hardening the conductive adhesive can be easily shaped to project in a tapered form.

When the projecting electrodes project in the shape of a cone, a relatively large space is formed between the projecting electrodes and the second connecting electrodes, compared with a case in which the projecting electrodes are hemispherically shaped. This prevents the conductive adhesive for connection from being horizontally spread out. Accordingly, although the projection may be hemispherically shaped in accordance with the present invention, cone shaped projections are preferred.

When the first electronic component is prepared in the form of a mother component that is to be cut later into a plurality of components, and the step of forming the projecting electrodes is performed before the mother component is cut, it is possible to form projecting electrodes on all of a plurality of connecting electrodes of a plurality of first electronic components in one process, and to thereby improve efficiency in forming the projecting electrodes.

When the conductive adhesive for connection is applied onto the projecting electrodes by dipping, it is possible to easily and efficiently apply a desired amount of conductive adhesive onto a plurality of connecting electrodes.

After the conductive adhesive for connection is hardened, a filling material can be easily filled between the first electronic component and the second electronic component, because the projecting electrodes stably maintain the space therebetween, and the conductive adhesive for connection is prevented from being horizontally spread out, as described above.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic component connecting method for electrically connecting a first electronic component having a first connecting electrode, and a second electronic component having a second connecting electrode via said first and second connecting electrodes, said method comprising the steps of:

forming a projecting electrode by applying and hardening a thermosetting conductive adhesive on said first connecting electrode, said projecting electrode being tapered or cone-shaped;

applying a hardenable conductive adhesive on at least one of said projecting electrode and said second connecting electrode;

aligning said first electrode component and said second electronic component before hardening said conductive adhesive so that the end of said projecting electrode and said second connecting electrode are in contact with each other; and hardening said conductive adhesive while said first electronic component and said second electronic component are aligned with each other to thereby connect said first connecting electrode to said second connecting electrode.

2. An electronic component connecting method according to claim 1, wherein said step of forming said projecting electrode includes a step of applying said thermosetting conductive adhesive by printing.

3. An electronic component connecting method according to claim 1, wherein said first electronic component is prepared in the form of a mother component that is to be cut later into a plurality of components, at least said step of forming said projecting electrode is performed before cutting said mother component, and said connecting method further includes a step of cutting said mother component into a plurality of said first electronic components.

4. An electronic component connecting method according to claim 1, wherein said step of applying said conductive adhesive for connection includes a step of applying said conductive adhesive for connection on said projecting electrode by dipping.

5. An electronic component method according to claim 1, further comprising a step of applying a filling material between said first electronic component and said second electronic component after said step of hardening said conductive adhesive for connection.

6. An electronic component connecting method according to claim 1, wherein said first electronic component includes a chip-type electronic component, and said second electronic component includes a wiring board.

7. An electronic component connecting method according to claim 3, wherein said step of forming said projecting electrode includes a step of applying said thermosetting conductive adhesive by printing.

8. An electronic component connecting method according to claim 7, wherein said step of applying said conductive adhesive for connection includes a step of applying said conductive adhesive for connection on said projecting electrode by dipping.

9. An electronic component connecting method according to claim 8, further comprising a step of applying a filling material between said first electronic component and said second electronic component after said step of hardening said conductive adhesive for connection.

10. An electronic component connecting method according to claim 9, wherein said first electronic component includes a chip-type electronic component, and said second electronic component includes a wiring board.

* * * * *